(12) United States Patent
Kondrat et al.

(10) Patent No.: US 8,107,256 B1
(45) Date of Patent: Jan. 31, 2012

(54) SERVICEABLE NETWORKING APPLIANCE CHASSIS

(75) Inventors: Paul Kondrat, Ottawa (CA); James Moser, Stittsville (CA); Scott Drennan, Ottawa (CA); Jonathan Bosloy, Kanata (CA); Charles Mitchell, Ottawa (CA); Shawn McAllister, Manotick, CA (US)

(73) Assignee: Solace Systems, Inc., Kanata, Ontario (CA)

( * ) Notice: Subject to any disclaimer, the term of this patent is extended or adjusted under 35 U.S.C. 154(b) by 1103 days.

(21) Appl. No.: 11/925,243

(22) Filed: Oct. 26, 2007

(51) Int. Cl.
*H05K 7/14* (2006.01)
(52) U.S. Cl. .......................... 361/796; 361/788
(58) Field of Classification Search .................. 361/796, 361/801, 788, 756; 710/300, 301
See application file for complete search history.

(56) References Cited

U.S. PATENT DOCUMENTS

| | | | | |
|---|---|---|---|---|
| 5,708,563 A * | 1/1998 | Cranston et al. | ........... | 361/679.6 |
| 6,049,449 A | 4/2000 | Cranston | | |
| 6,325,636 B1 * | 12/2001 | Hipp et al. | ....................... | 439/61 |
| 6,563,706 B1 * | 5/2003 | Strickler | ....................... | 361/695 |
| 6,618,260 B2 | 9/2003 | Willis | | |
| 6,742,068 B2 * | 5/2004 | Gallagher et al. | ............ | 710/302 |
| 7,295,442 B2 * | 11/2007 | Garnett et al. | ................ | 361/728 |
| 7,489,523 B2 * | 2/2009 | Hsu | ............................... | 361/801 |
| 7,602,611 B2 * | 10/2009 | Peng et al. | .................... | 361/728 |

* cited by examiner

*Primary Examiner* — Dameon Levi
(74) *Attorney, Agent, or Firm* — Marks & Clerk

(57) ABSTRACT

A networking appliance includes a chassis, an off-the-shelf motherboard mounted on said chassis, said motherboard including at least one expansion bus, one or more separately removable expansion module mounted on said chassis, and a number of card slots in the expansion module for accommodating expansion cards. A connection arrangement provides a signal connection between the card slots in the expansion modules and the expansion buses.

23 Claims, 7 Drawing Sheets

SERVICEABLE NETWORKING APPLIANCE CHASSIS

FIELD OF THE INVENTION

This invention relates to data communication devices, and in particular to a network appliance that may be constructed commodity components.

BACKGROUND OF THE INVENTION

In the field of data communications, a current trend is the use of smaller scale appliances to perform specific network functions. Functions suited to this network architecture are typically ones that require relatively small amounts of processing capacity spread around the network in different geographic locations. These types of applications which include firewall/security applications or content routing (among many other networking functions), are in many cases not best served by large backplane based systems. A common architecture for a networking appliance is to build the system around a commodity computer (PC) motherboard. The motherboard provides the appliance with a relatively inexpensive yet powerful processing complex. Customizations can be added to the appliance by connecting (or plugging in) expansion cards to an expansion bus present in the system. The expansion bus may be PCI, PCI Express, Hypertransport or any expansion bus present in on a PC motherboard. The mix of expansion cards present in the system will depend on the application and capacity of the appliance and could be other commodity cards such as a network adaptor or custom hardware accelerators specific to the application for which the appliance is designed. The networking appliance architecture described above has many advantages from a cost of goods, cost of development and time to market points of view; the fast pace of innovation in the PC market place also provides almost constant improvements in performance. For the cost of qualifying the latest motherboard/processor combination and incorporating it into the system a performance gain can be realized. However networking appliances of this architecture are often deficient when it comes to user serviceability of field replaceable components and upgrade of system components when compared to larger custom designed backplane based systems. The scalability of a system based on a commodity motherboard may also be limited based on the application and the required number of expansion cards; PC motherboards typically have a limited number of expansion slots. Manufacturers of networking appliances of the type described above also incur added complications to supply chain and product lifecycle management as a result of the accelerated lifecycle common with commodity hardware components. Relative to custom designed components, commodity components require constant design effort to qualifying new hardware components to replace parts that have reached the end of their product lifecycle.

Methods of improving the serviceability of cards plugged into the expansion bus of a computer system are described in U.S. Pat. No. 7,236,358 herein included by reference; here the expansion bus of the system is extended to a backplane that is accessible from the rear of the chassis. A system configured as such would require many vertical units of datacenter rack space due to the length of the expansion cards; in order to achieve a reasonable volumetric efficiency of processing power per unit of rack space multiple processing complexes must be combined into a single chassis. The present invention improves upon this by providing a method by which a single processor complex can have a serviceable expansion bus in a smaller form factor (4 vertical rack units or less).

Other standard computer form factors designed for embedded markets such as the PCI Industrial Computer Manufactures Group (PICMG) standard 1.3 herein included by reference, provide more slots than standard commodity PC motherboards but suffer from the same user serviceability and upgradeability issues. Systems built around specialty motherboards (such as those designed to the PICMG 1.3 specification) also tend to be more expensive because they are not produced in the same volumes as commodity motherboards. The present invention provides a method of customizing and enhancing the expansion bus of a system to allow the number and types of slots present on the expansion bus and the connectivity between them to be extended and configured in an application specific way similar to systems based on the PICMG 1.3 standard. The techniques presented here improve upon systems based on the PICMG specifications by providing a solution that is more easily serviceable in the field and is based on commodity components making it more cost effective.

SUMMARY OF THE INVENTION

The present invention provides a networking appliance that can be constructed using many commodity components while maintaining a high degree of upgradeability and user serviceability rivaling that of backplane based systems. Embodiments of the invention permit components of the system that are likely to change to be isolated. It may be desirable to change the motherboard to increase performance; taking advantage of the high rate of innovation provided by PC motherboard manufactures. It may also be required to substitute the motherboard because of component obsolescence; due to the accelerated product lifecycles common in the PC marketplace. Mechanical isolation of system components that are likely to change will reduce the time to market and costs associated with the introduction of new components to the system.

The techniques of the present invention can be used in the development of communications appliances to create systems that make use of the advantages of commodity hardware while minimizing the drawbacks of similar systems.

In order to reduce the effort and cost required in the design of a networking appliance it is common to utilize commodity PC hardware. Unfortunately, systems of this type suffer from reduced user serviceability and upgradeability relative to fully custom designs based on a backplane with pluggable cards. The expansion bus in a typical PC is not designed to allow cards to be easily inserted or removed. The typical upgrade procedure for an expansion card in a PC chassis involves removing the system from the datacenter rack, removing the lid from the chassis, installing the card, re-installing the lid and placing the PC back in the datacenter rack; depending on the size and weight of the system being upgraded two people may be required to lift the system in and out of the rack. It is highly desirable to have a system that can be serviced and/or upgraded by a single person without tools and without having to remove the system from the rack. The present invention describes a chassis design that will allow expansion cards (and any other user serviceable component) to be added or removed from the system by a single person while the chassis remains in the datacenter rack.

According to the present invention there is provided a networking appliance comprising a chassis; an off-the-shelf motherboard mounted on said chassis, said motherboard including at least one expansion bus; at least one separately removable expansion module mounted on said chassis; a plurality of card slots in said expansion module for accommodating expansion cards; and connection means for providing a signal connection between card slots in said at least one expansion module and said at least one expansion bus.

An embodiment of the invention thus provides a method by which one or more portion(s) (or segment(s)) of the expansion bus can be removed from the system as a module. The removable expansion bus module is a small subset of the system and as such can be easily handled by a single person for the purpose of transporting it to a location where it is convenient to service the module. Servicing the module can involve actions such as removing a card, installing a new card or upgrading the entire module to one with a different card configuration.

The motherboard can be mechanically isolated from the expansion bus. The mechanical isolation between the motherboard and the expansion bus module is accomplished by a flexible cable that extends the expansion bus to the module; this removes mechanical dependencies between the expansion bus module and the motherboard. The mechanical loose coupling between the motherboard and the expansion bus facilitates the easy substitution of the motherboard for a different model in the likely event that the motherboard becomes unavailable due to component obsolescence or higher performance models become available.

Embodiments of the invention provide a chassis design that provides for increased serviceability and upgradeability for appliances based on off the shelf and custom built boards by using expansion module cages and blind mate connectors.

The expansion module cages can be fitted with a spring loaded lid to assist in the retention of cards in the card slots to provide enhanced mechanical stability.

Embodiments of the invention feature a level of user serviceability commonly only found on much larger backplane based blade systems.

BRIEF DESCRIPTION OF THE DRAWINGS

The invention will now be described in more detail by way of example with reference to the accompanying drawings in which.

DETAILED DESCRIPTION OF THE PREFERRED EMBODIMENTS

Figure 1:
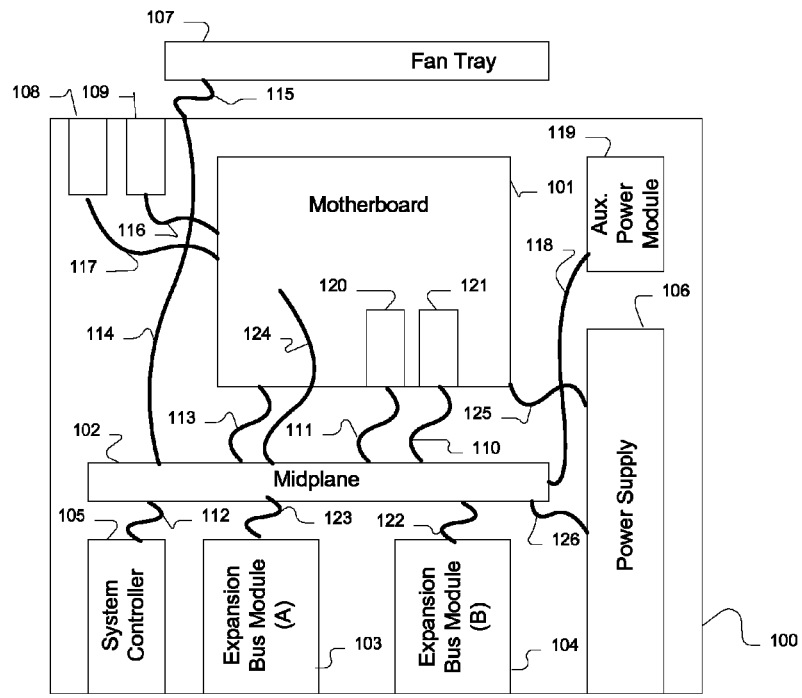
FIG. 1 shows a block diagram of the major components and critical interconnections of a networking appliance based on a commodity PC motherboard.

FIG. 1 depicts a block diagram of a serviceable networking appliance. The system consists of a series of components; the chassis 100, the motherboard 101, the mid-plane 102, expansion bus modules 103-104, the system controller 105, the power supply 106, the fan tray 107, the hard drives 108-109, the auxiliary power module 119 and the bus cable adaptor cards 120-121. The chassis 100 is typically a metal enclosure suitable to be rack mounted in a data center or central office; it either houses or provides attachment points for all other system components. The motherboard 101 is a standardized, commercially available component; it is the central component of the system and contains the microprocessors. The mid-plane 102 is a printed circuit board (PCB) that provides interconnect between the system components; it provides connection points for cables from a number of system components as well as connections suitable for blind mate that allow the expansion bus modules 103-104 to be inserted and removed from the chassis without removing it from the rack The expansion bus modules 103-104 are mechanical assemblies that can be removed from the chassis; they contain a number of electrical and mechanical components that allow the system to be configured via the addition of expansion cards. The expansion bus module 103-104 has a connector on the rear that interfaces to a mating connector on the mid-plane 102; all communications between the module 103-104 and the rest of the system components (including the motherboard 101) are through this connector. When removed from the chassis the expansion bus module 103-104 may have a hinged lid that, when closed, helps to retain add-in cards that are contained within the bus expansion module 103-104. In addition to the metal frame that encloses the expansion bus module 103-104, it consists of an expansion bus backplane which has a number of expansion slots (PCI, PCI-X, PCIe, Hypertransport or other) that may be used to connect additional add-in cards to the system. The system controller 105 is a PCB that houses circuitry to allow communication between system components, including the motherboard 101, the fan tray 107, and the expansion bus modules 103-104. The system controller 105 must also present a number of user interfaces to the system in a way that is independent of the motherboard 101; these interfaces may be ethernet, serial, keyboard, mouse, USB, VGA or other user accessible interfaces. The system controller 105 is also responsible for controlling any visual indicators (LEDs or text displays for example) as well as any push button inputs (power or reset buttons for example), alarm inputs (e.g. environmental scan points) or alarm outputs. The power supply 106 is responsible for delivering power to all of the system components; it may be a monolithic device or a modular device that features removable modules that can be over provisioned to provide redundancy. The primary side inputs to the power supply 106 could be AC or DC depending upon the environment in which the appliance is to be installed. The secondary side of the power supply 106 is a cable harness that can be connected to the various system components to provide them with power in the form of low voltage DC current. The fan tray 107 is a modular component that can be attached or removed from the front of the chassis 100 while it is mounted in a datacenter rack. The fan tray 107 is required to provide airflow for the purpose of cooling system components such as the motherboard 101 and add in cards contained in the expansion bus module 103-104. It contains a number of discrete fan elements for redundancy. The hard drives 108-109 provide mass storage to the system and may contain the operating system, software programs, log files or any other information that needs to be stored on a volatile medium. Hard drives 108-109 may be rotating disks or solid-state storage. FIG. 1 shows two hard drives 108-109 however many motherboards 101 support connections to six or more hard drives and add-in controller boards can be used to add connections for even more hard drives. The hard drives 108-109 can be configured as a RAID group if required providing data integrity in the event of a device failure. In the case that the hard drives 108-109 are configured as a RAID group it is a desirable feature to be able to easily replace a failed hard drive 108-109 without disassembling the system; many systems are designed to allow a hard drive 108-109 to be removed from the front of the chassis while it remains in the rack. The auxiliary power module 119 is an energy storage device that can be used to provide power to critical system components in the event of a failure of the power supply 106 or the power distribution network inside the datacenter or central office. The expansion bus cable adaptor boards 120-121 are printed circuit boards (PCBs) that connect to the expansion bus of the motherboard and convert it to a format that is suitable for transport over a flexible cable, thereby allowing communication to but providing mechanical isolation to the expansion modules.

The components depicted in FIG. 1 are connected via a series of flexible cables and rigid interconnects. The expansion bus of the motherboard 101 is connected to the mid-plane 102 via two cables 110-111. The expansion bus cables 110-111 connect to expansion slots on the motherboard 101 via expansion bus cable adaptor boards 120-121. The externally visible inputs and outputs from the motherboard 101 (ethernet, serial, USB, VGA, keyboard, mouse etc.) can be extended to the mid-plane 102 via series of cables 113; they may be carried over the mid-plane 102 to the system controller 105 where they can be made externally accessible. The motherboard 101 front panel connections (including LED drivers, power and reset push buttons etc.) are connected to the mid-plane 102 via a cable 124. The front panel connections are routed on the mid-plane 102 to the system controller 105 where the push button buttons can be made externally accessible and the LEDs can be made externally visible. The system controller 105 may also terminate the front panel connections on a programmable logic device (PLD); this would allow the functions of the motherboard 101 signals to be operated upon by a transfer function implemented in the PLD. The transfer function implemented in the PLD could be tailored to the particular model of motherboard accounting for minor functional differences between motherboard models. This would help make it possible to change the motherboard 101 to a model from a different manufacturer while maintaining the same externally visible behaviors. The hard drives 108-109 are connected to the motherboard via cables 116-117; these may be ATA, SATA, SCSI, SAS or other. Connections 122-123 between the mid-plane 102 and the expansion bus module(s) 103-104 are made via connectors that are suitable for blind mating. The use of the blind mate connections between the mid-plane 102 and the expansion bus module 103-104 allows the entire module 103-104 to be inserted and removed from the rear of the chassis 100 while the system remains powered in the datacenter rack. The system controller 105 is connected to the mid-plane 102 via connection 112. The mid-plane 102 acts as a wiring hub for the system controller 105 and gathers up connections to and from the fan tray 107, the motherboard 101, the power supply 106 and the expansion bus module(s) 103-104. Connections between the mid-plane 102 and the fan tray 107 are made via cable 114; for the containment of electromagnetic emissions it is desirable to have cable 114 terminate at the wall of the chassis 100. The connector 115 at the end of cable 114 that terminates at the wall of the chassis 100 may be suitable for blind mating to facilitate easy installation and removal of the fan tray 107 by the system user. The power supply 106 is connected to the motherboard 101 by cable 125 and to the mid-plane 102 via cable 126; there may also be connections to the hard drives 108-109. The mid-plane 102 further distributes power to the system controller 105 and the bus expansion modules 103-104. The auxiliary power module 119 connects to the mid-plane 102 via cable 118. Auxiliary power is further distributed to critical system components contained within the expansion bus module 103-104 by the mid-plane 102. The fan tray 107 connects to the chassis via connection 115; this could be a cable or a blind mate connector depending on the design of cable 114. It is a desirable feature of a chassis to have a fan tray that can be installed or removed while the chassis 100 is installed in a datacenter rack.

Figure 2:
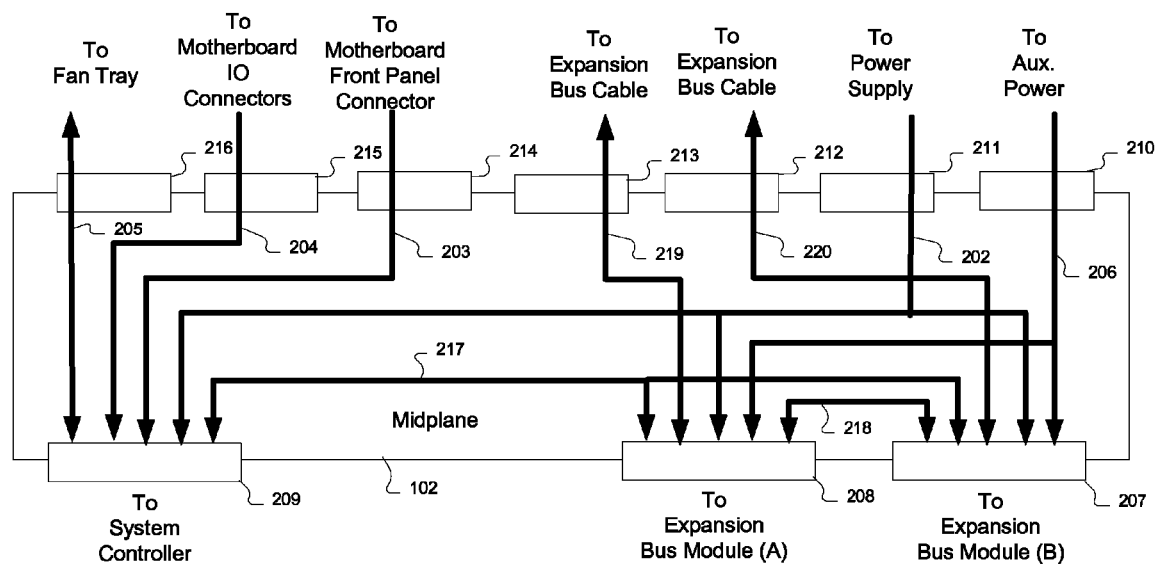
FIG. 2 shows a diagram of the interconnections required on a mid-plane suitable for use in a serviceable networking appliance chassis.

FIG. 2 is a diagram of the connectivity provided by the mid-plane 102. The mid-plane 102 acts as a wiring hub connecting all of the system's major components: the motherboard 101, the expansion bus modules 103-104 and the system controller 105. Some of the connections to the mid-plane 102 are made via cables and some are made via blind mate connectors. The following connectors on the mid-plane mate to cables: auxiliary power module connector 210 (via cable 118), power supply connector 211 (via cable 126), expansion bus cable connector B 212 (via cable 122), expansion cable connector A 213 (via cable 123), motherboard front panel connector 214 (via cable 124), motherboard input and output connectors 215 (via cable 113) and the fan tray connector 216 (via cable 114). The expansion bus module connections 207-208 could be made by cables or via blind mate connectors. The system controller connection 209 could be made by a variety of fixed PCB to PCB connector types, blind mate connectors or a flexible cable.

The mid-plane 102 provides connectivity 206 between the auxiliary power connector 210 and each of the expansion bus module connectors 207-208. The power supply connector 211 connects into a power bus 202 provided by the mid-plane 102 that distributes power to each of its daughter modules (the expansion bus modules 103-104 and the system controller 105) via connectors 207-209. Each expansion bus cable connector 212-213 has connectivity to one of the expansion bus module connectors 207-208; these connections 219-220 are routed point to point on the mid-plane 102. The motherboard 101 front panel connections are routed point to point through the mid-plane 102 from connector 215 to the system controller connector 209 via connection 203. The motherboard 101 input and output connections (ethernet, serial, VGA, USB etc.) connect to the mid-plane 102 via connector 215; this may be a series of function specific cables or an integrated cable harness designed to gather all of the motherboard 101 connections into a single connector on the mid-plane 102. The motherboard 101 inputs and outputs are routed directly to the system controller connector 209 via connection 204 where the system controller 105 will extend the connections to make them accessible externally. The mid-plane 102 provides connectivity 205 between the system controller connector 209 and the fan tray connector 216; these connections are used to gather status from and provide power to the fan tray 107. A system management bus 217 between the system controller connector 209 and each of the expansion bus module connectors 207-208 is provided for functions such as controlling the secondary power supplies of the bus expansion modules 103-104 and collecting status and inventory information from the expansion bus modules 103-104. The system management bus 217 could be implemented using many protocols such as RS232, USB, I2C or other. An inter-expansion bus module connection 218 between the expansion bus module connectors 207-208 could optionally be included for future expansion; these connections 218 could be used with PCI non-transparent bridging technology to provide peer to peer connectivity between expansion bus modules 103-104 or could be used to connect the expansion bus modules 103-104 together using a secondary data path switch fabric.

Figure 3:
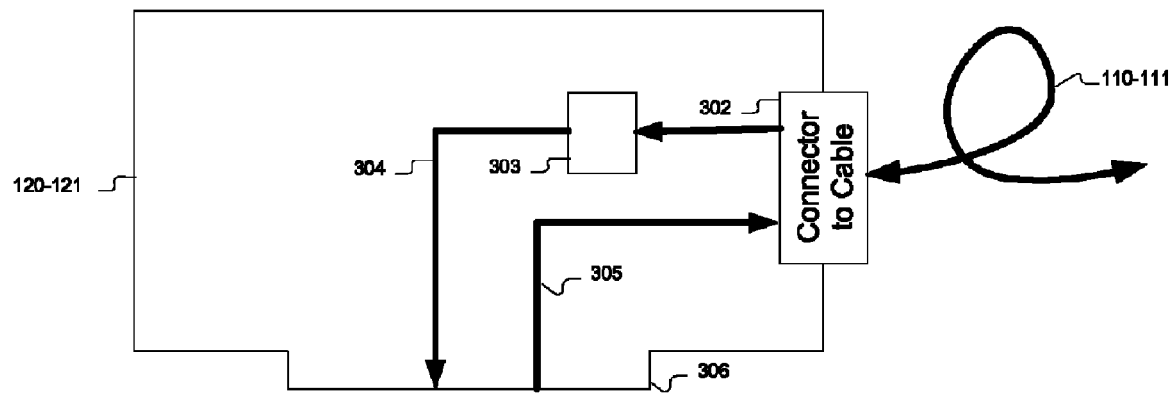
FIG. 3 shows a block diagram of an adaptor card capable of extending the expansion bus of a PC motherboard over a cable.

FIG. 3 is a block diagram of an expansion bus cable adaptor module 120-121. The purpose of the expansion bus cable adaptor(s) 120-121 are to convert from the card edge style connectors common on PC motherboards to a format that is suitable for routing over a flexible cable. The card edge connector 306 of the expansion bus cable adaptor 120-121 is designed to interface with the expansion bus connectors on the motherboard 101. The expansion bus on the motherboard 101 could be PCI, PCI-X, PCIe, Hypertransport or other expansion bus type. The expansion bus cable adaptor module 102-121 depicted in FIG. 3 is for a bus protocol that has separate transmit and receive signals such as PCIe or Hypertransport but a similar module could be designed for parallel bus technologies such as PCI or PCI-X. The transmit signals 305 are routed directly from the card edge connections 306 to the cable connector 302. The receive signals are routed from the cable connector 302 to a repeater device 303. It is the purpose of the repeater device 303 to remove noise from the signals received over the cable 110-111 before they are forwarded to the receiver chips on the motherboard 101. The repeater device 303 electrically isolates the motherboard 101 circuit board traces from the expansion bus extension to the expansion bus modules 103-104 reducing the characterization effort required when substituting motherboard technologies in future system iterations. The clean signals from the repeater device 303 are connected to the card edge connector 306 via connections 304.

Figure 4:
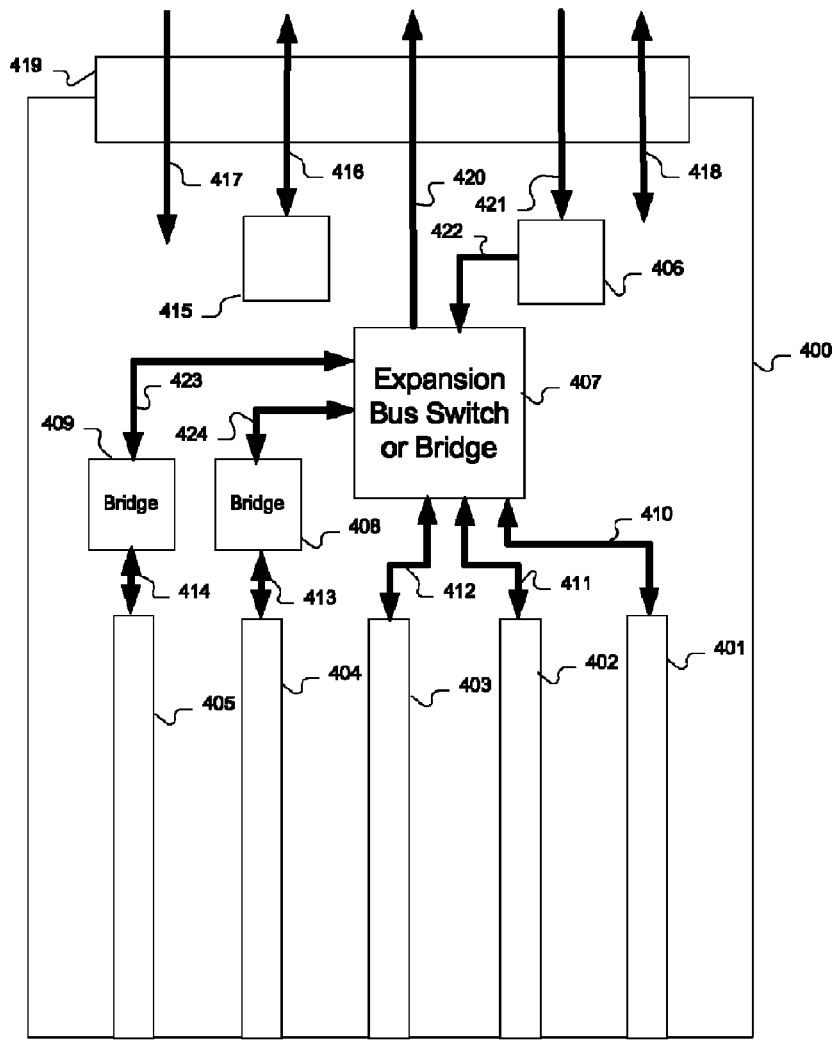
FIG. 4 shows a block diagram of an expansion bus backplane suitable for use in an expansion bus module.

FIG. 4 is a block diagram of the expansion bus backplane 400 contained within the expansion bus module 103-104. The expansion bus backplane 400 is a PCB that is contained within the metal frame 700 (shown in FIG. 7) of the expansion bus module 103-104; its primary function is to provide a number of expansion slots 401-405 into which add-in cards can be inserted. The expansion bus module 103-104 consists of the expansion bus backplane 400 which provides the add-in cards with connectivity back to the expansion bus of the motherboard 101 and the metal frame 700 which provides mechanical stability to the add-in cards. The expansion bus backplane 400 communicates to the rest of the system components through the expansion bus module connector 419. All connections to and from the expansion bus module 103-104 are carried through the expansion bus module connector 419; which could be a blind mate connector to improve the serviceability of the system by enabling the expansion bus module 103-104 to be installed in the system from the rear of the chassis 100. The inter-expansion bus module link 418 is an optional connection between expansion bus modules 103-104; possible uses for which have been previously described. The power connection 417 to expansion bus backplane 400 is also received over the expansion bus module connector 419 and may undergo secondary regulation or conversion before it is distributed to the expansion slots 401-405 and or integrated circuits on the expansion bus backplane 400 itself. The system management bus 217 is routed on the expansion bus backplane 400 via connection 416 to an expansion bus backplane management device 415; which gathers status from components on the expansion bus backplane 400 and makes it accessible to the system controller 105. The expansion bus backplane management device 415 could be implemented in a PLD or a small microprocessor. The connections to the expansion bus of the motherboard 101 are made via connections 420-421 which are designed to interface to the signals from the expansion bus cable adaptor 120-121. As drawn in FIG. 4 the expansion bus backplane 400 is designed to work with an expansion bus protocol that features separate transmit and receive paths such as PCIe, Hypertransport or other. Similar to FIG. 3 the receive path has a repeater device 406 to remove noise added to the signal while in transit over the expansion bus cable 110-111 and the mid-plane 102. The repeater device 406 removes noise present on receive path signals 421 before forwarding them to the expansion bus switch 407 via connection 422. The expansion bus switch 407 is a device that provides connectivity between expansion slots 401-405 and the processor complex of the motherboard 101 or peer to peer connectivity between expansion slots 401-405. The expansion bus switch 407 could also optionally be a multi-ported bridge depending on the technology used by the motherboard expansion bus. Expansion bus bridges 408-409 are another class of device that could be used on the expansion bus module backplane 400 to convert or buffer between different segments of the expansion bus. The example depicted in FIG. 4 shows an expansion bus switch 407 connecting to an upstream port toward the motherboard 101, that consists of transmit link 420 and receive link 422 and provides connectivity to downstream expansion slots 401-405; this could be using a technology such as PCIe. In this example expansion slots 401-403 use the native bus technology of the bus switch 407 (PCIe for example) and expansion slots 404-405 are connected to the expansion bus switch 407 via bridging devices 408-409. In this example expansion slots 404-405 use a different bus technology than is native to the expansion bus switch 407 (PCI-X for example). The bridging devices 408-409 are used in this case to convert between expansion bus technologies (PCIe and PCI-X for example) but could also be used as a buffer between two bus segments to reduce loading on a bus that is shared between multiple expansion slots. The expansion bus switch 407 is connected to expansion slots 401-403 via connections 410-412; in this case the connections use separate point to point links for transmit and receive signals. Connections to expansion slots 404-405 are made via the bridging devices 408-409 which are connected to the expansion bus switch 407 via separate transmit and receive links 423-424 (similar to 410-412). Between the bridging devices 408-409 and expansion slots 404-405 the connections 413-414 use the same signals bi-directionally; put another way the connections 413-414 use the same signals for transmit and receive. There are many possible implementations of expansion bus backplane 400 within the scope of the present invention using any of the many commercially available (or proprietary) bus switching and bridging devices and the ability to create new configurations and upgrade to them is a strength of the present invention. An expansion bus backplane 400 may contain expansion bus slots of different types (PCI, PCI-X, PCIe, Hypertransport or other); it may also include any number of expansion slots.

Figure 5:
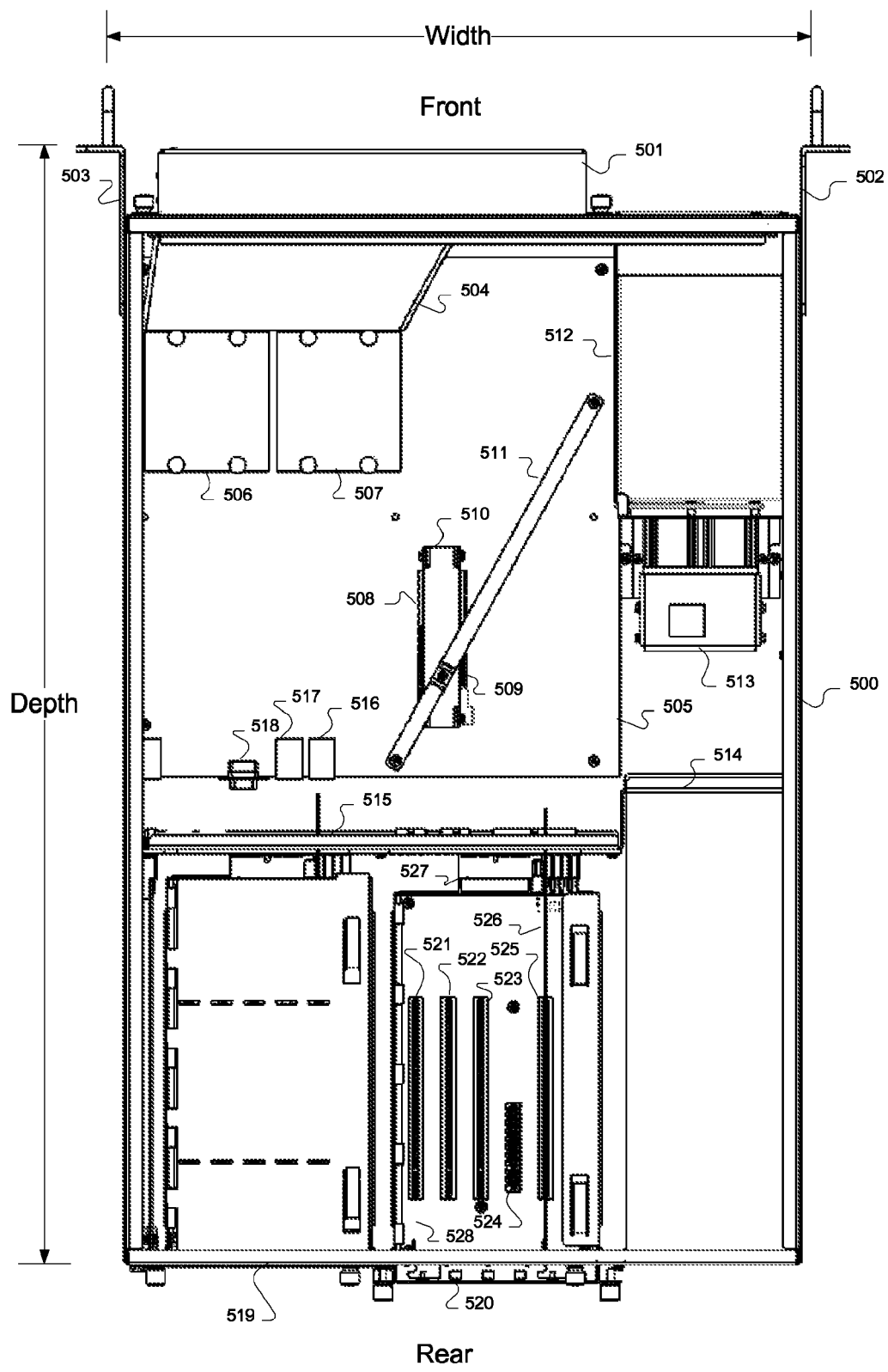
FIG. 5 shows the top view of a networking appliance chassis.

FIG. 5 depicts a possible physical implementation of the invention viewed from the top. The lid of the chassis 500 is removed revealing the internal components; the cable interconnects are not shown. The fan tray 501 corresponds to the fan tray 107 of FIG. 1. The motherboard 505 corresponds to the motherboard 101 of FIG. 1. The expansion bus modules 519-520 correspond to the expansion bus modules 103-104 of FIG. 1. Expansion bus module 520 is shown with the lid removed to reveal the expansion bus backplane 528. The mid-plane 515 corresponds to the mid-plane 102 of FIG. 1. The power supply 514 corresponds to the power supply 106 of FIG. 1. The expansion bus cable adaptors 508-509 correspond to the expansion bus cable adaptors 120-121 of FIG. 1. The hard drive(s) 512 shown here stacked one on top of the other correspond to the hard drives 108-109 of FIG. 1. The auxiliary power module 513 corresponds to the auxiliary power module 119 of FIG. 1. FIG. 5 shows a number of mechanical parts not shown in the system block diagram of FIG. 1. The rack mount ears 502-503 are used to secure the chassis in the data center rack. The processors 506-507 are major components of the motherboard 505 and must be cooled by air flow that is directed into their heat sinks by an air duct 504. Motherboard inputs and outputs 516-518 are cabled over to the mid-plane 515 (cables not shown). A bracket 510 is used to secure the expansion bus cable adaptor boards 508-509 to each other and a metal strap 511 is used to provide some spring force to ensure that the expansion bus cable adaptor boards 508-509 remain seated properly in the motherboard expansion bus slots. Standard methods for securing expansion cards to the motherboard 505 are not used because they would interfere with the mid-plane 515. From FIG. 5 it is clear that any standard motherboard compliant to the Server System Infrastructure Forum (SSI) EEB3.61 specification herein included by reference could be easily used with the chassis 500. The EEB3.61 specification does not define the exact locations of the motherboard inputs and outputs or the locations and types of the motherboard expansion bus slots; for this reason these features of the motherboard are isolated from other system components by flexible cables. The isolation of the motherboard 505 features by flexible cables will make it possible to easily change the motherboard 505 to a different model for supply chain reasons or to improve performance. The Expansion bus module 520 is shown partially inserted into the chassis to reveal details of the blind mate connector 527 between the expansion bus module 520 and the mid-plane 515. Expansion bus module 520 is shown with its lid removed to reveal the expansion bus backplane; expansion slots 521-525 correspond to expansion slots 401-405 of FIG. 4. An add-in card 526 is shown installed in one of the expansion slots 525.

Figure 6:
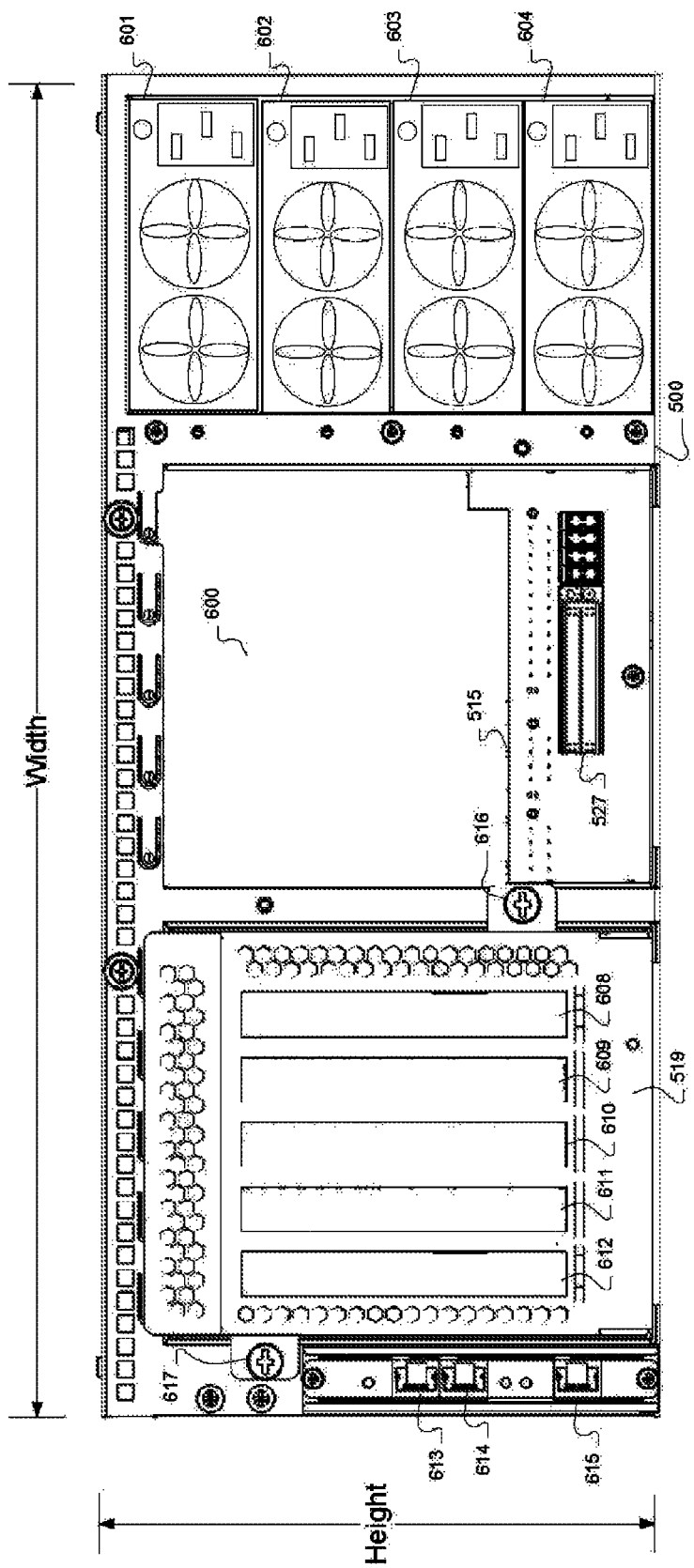
FIG. 6 shows the rear view of a of a networking appliance chassis.

FIG. 6 shows a possible physical implementation of the invention viewed from the rear. From this view the individual power supply modules 601-604 that make up the power supply 514 are visible; each one can be inserted or removed from the rear of the chassis 500. The externally accessible motherboard inputs and outputs 613-615 are visible; in this case two ethernet ports and a serial port are present. The rear of the chassis 500 has two positions capable of accepting expansion bus modules 103-104. The left most expansion bus module position is shown with an expansion bus module 519 installed; the right most expansion bus module position 600 is shown with expansion bus module 520 removed. The expansion bus module 519 has a rear wall with five bulkhead slots 608-612 for receiving the add-in card bulkheads and exposing them to the rear. Visible with the right most expansion bus module removed is the mid-plane 515 along with the blind mate connector 527. From FIG. 6 it can be seen how by loosening the thumb screws 616-617 the entire expansion bus module 519 including any add-in cards that are installed in it could be removed as a unit while the chassis 500 remains in place in the datacenter rack. The expansion bus module 519 is physically smaller and lighter than the entire chassis 500 and can easily be removed by a single person. With the expansion bus module 519 removed from the chassis 500 a user can install or remove add-in cards from the bus expansion module 519 in a convenient location and then re-install the expansion bus module 519 back in the chassis 500; this greatly improves the serviceability of the system relative to ones where the entire chassis needs to be removed from the datacenter rack to access the add-in cards.

Figure 7:
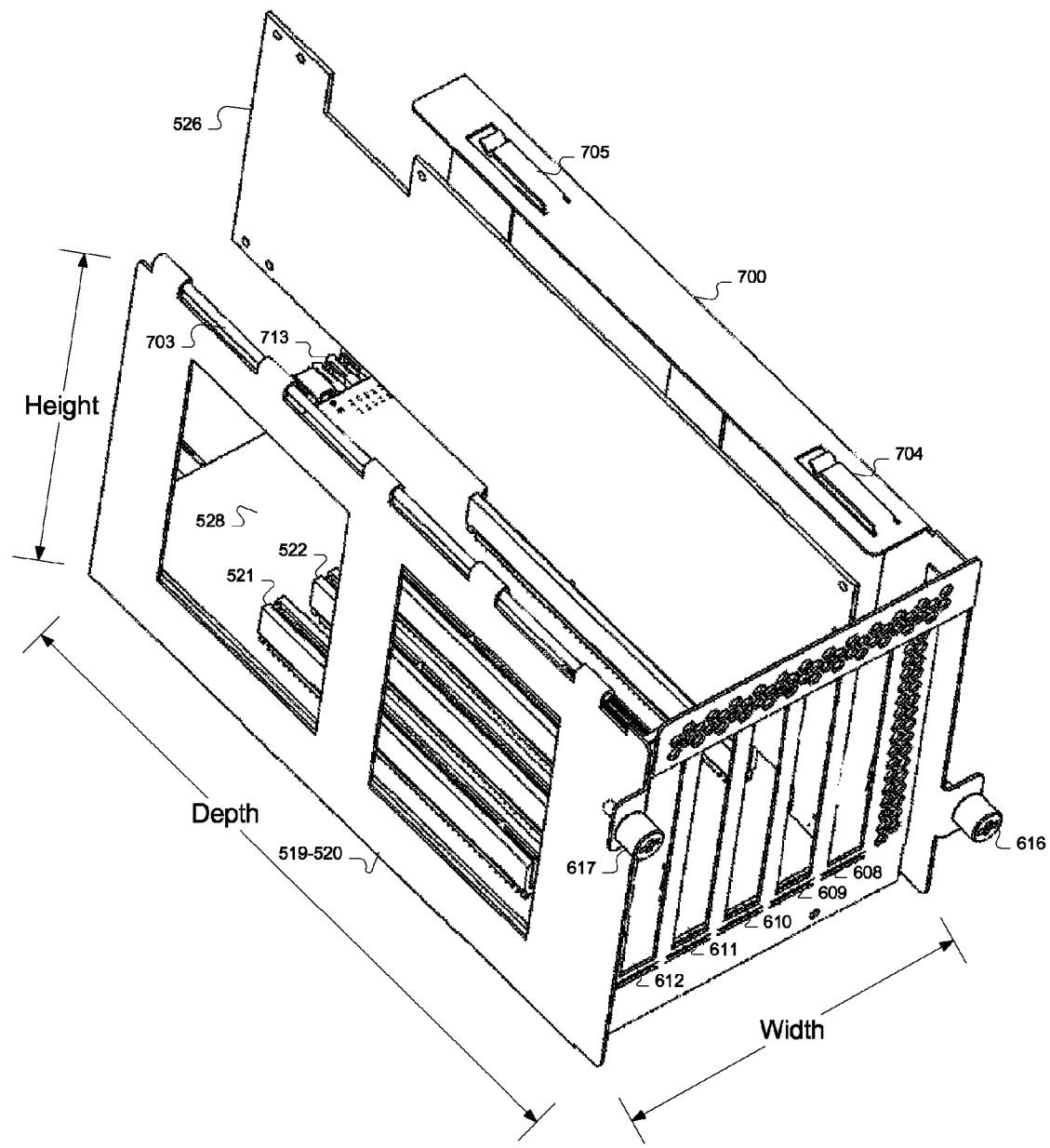
FIG. 7 shows the expansion bus module.

FIG. 7 shows a possible physical implementation of the expansion bus module 519-520 removed from the chassis 500. In this view the lid of the expansion bus module 519-520 is removed to reveal the internal details of the device. The expansion bus module 519-520 consists of a metal frame 700 that contains an expansion bus backplane 528. The metal frame 700 of the expansion bus module 519-520 has openings 608-612 in the rear of the module to accommodate the faceplates of add-in cards. The lid of the expansion bus module 519-520 (not shown here) attaches to the rod 703; this forms a hinge that allows the lid to be opened and closed. The lid when closed will help to retain the add-in cards by applying downward pressure to the top surfaces of the faceplates of the add-in cards and by applying downward spring force via a flexible plastic strap attached to the underside of the lid. When the lid is opened, access is given to the add-in cards contained within the expansion bus module 519-520; allowing add-in cards to be inserted or removed. Tabs 704-705 on the metal frame provide a slide and lock mechanism to secure the lid of the expansion bus module 519-520 when closed. An add-in card 526 is shown inserted into expansion slot 608; the add-in card 526 is inserted into a card edge connector on the expansion bus backplane 528 that is similar to the connectors 521-522 used for other bulkhead slots 609-612. The expansion bus module 519-520 is secured in the chassis 500 by two thumb screws 616-617. The use of thumb screws 616-617 combined with the slide and lock lid mechanism allows for an add-in card to be installed or removed from the system with no tools by a single operator while the system is in the datacenter rack; this greatly improves the serviceability of the system when compared to other server chassis designs. The blind mate connector 713 shown at the rear of the expansion bus module 519-520 is designed to mate with connector 527 of the mid-plane 515. It is also possible within the scope of the invention to develop an expansion bus module 519-520 with the auxiliary power module 119 incorporated; in this case the auxiliary power module would reside in the area underneath the expansion bus backplane 528, between the metal frame 700 and the bottom surface of the expansion bus backplane 528.

Figure 8:
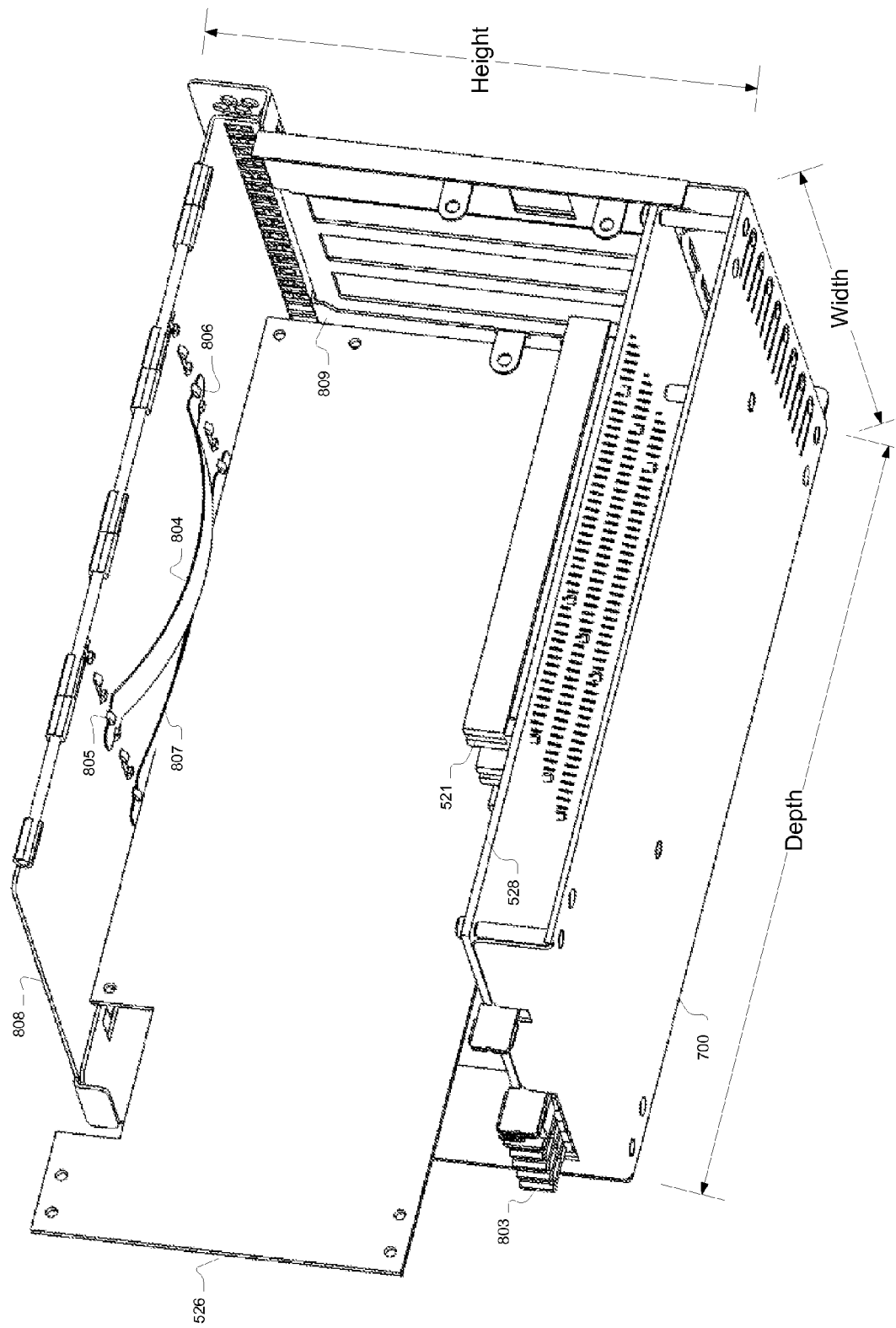
FIG. 8 shows a card retention mechanism that could be used in an expansion bus module.

FIG. 8 shows a possible physical implementation of the expansion bus module 519-520 with the side of the metal frame 700 removed; this allows the details of the lid and card retention mechanisms to be seen. The expansion bus backplane 528 with the card edge expansion slot connector 521 and blind mate connector 803 (mates mid-plane blind mate connector 527) at the rear of the module is retained by the metal frame 700. With the side of the metal frame 700 removed the add-in card 526 can be seen with its faceplate 809. The lid 808 of the expansion bus module 519-520 is shown in the closed position pressing down on the faceplate 809 of the add-in card 526. The physical dimensions of the add-in card's faceplate are defined by standards created by organizations like the PCI Special Interest Group (PCI-SIG); this allows the lid 808 to be designed to accommodate a variety of cards with standard faceplates. The lid 808 of the expansion bus module 519-520 also acts to retain the add-in card 526 by providing downward spring force; pressing the add-in card 526 into the card edge connector (similar to card edge connector 521) on the expansion bus backplane 528. The spring 807 is formed by a flexible plastic strip that is retained in the lid 808 of the expansion bus module 519-520 by bridge lances in the lid 808. The retention mechanism is shown in another slot without the add-in card present to show how the spring is formed; flexible plastic strap 804 is retained by bridge lances 805-806 to form a bend. By adjusting the length of the flexible plastic strap 804 the height of the spring can be adjusted to account for differences in the heights of the add-in cards.

Figure 9:
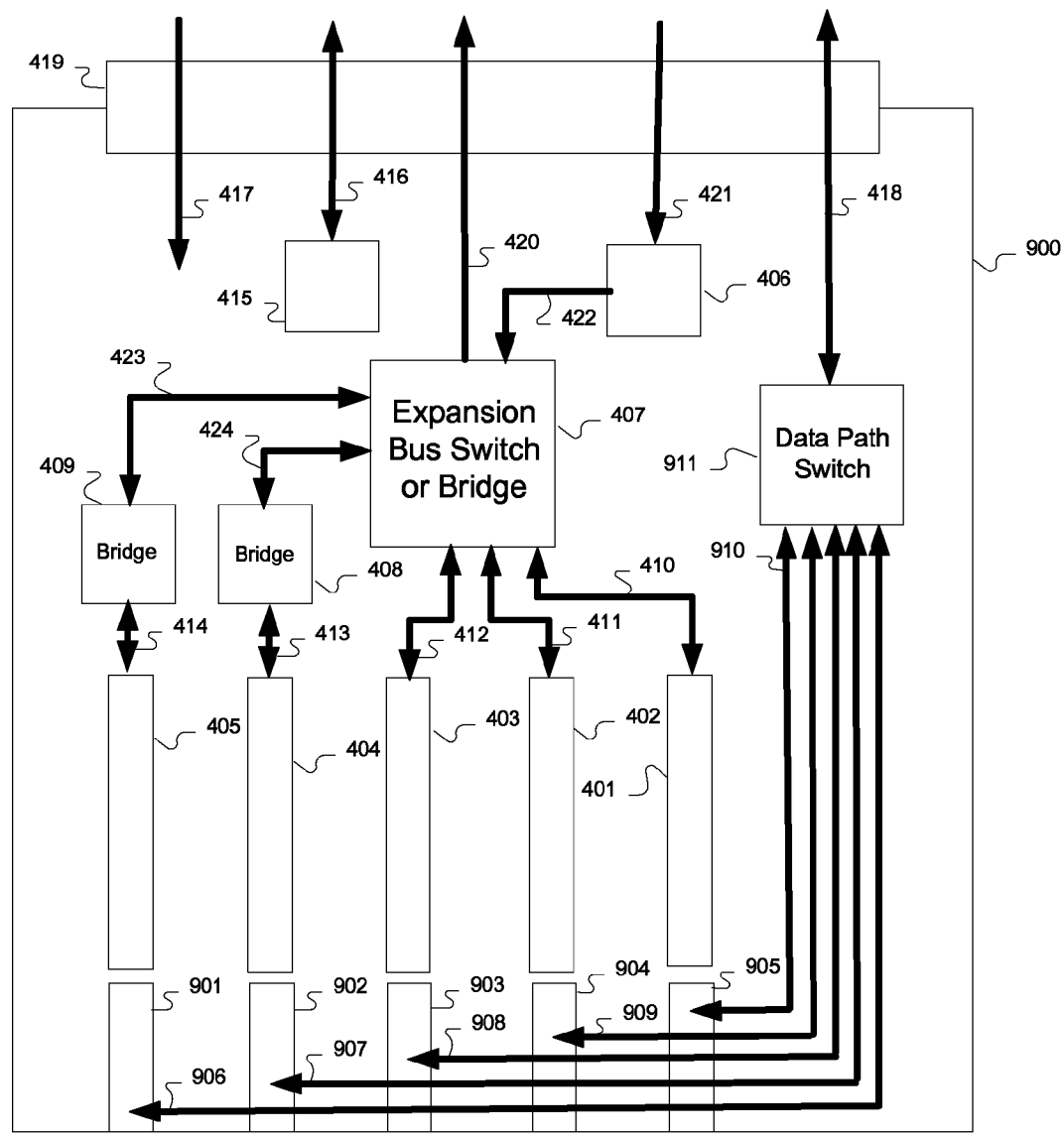
FIG. 9 shows an enhanced expansion bus backplane featuring a datapath switch fabric.

FIG. 9 shows a block diagram of an enhanced expansion bus backplane 900. The enhanced expansion bus backplane 900 functions in a similar fashion to the expansion bus backplane 400 of FIG. 4 with the addition of a secondary data path switch 911. Each of the expansion card slots 401-405 has an extension connector 901-905; this could be a card edge connector or a cable extending from a connector on the add-in card to a connector on the enhanced expansion bus backplane 900. The extension connector 901-905 has additional signals routed to it that can be used by a new generation of add-in card to provide enhanced performance. The extension connector signals 906-910 are routed point to point to a secondary data path switch 911 which provides high speed connectivity between add-in cards with an interface that is more efficient for packet communications than standard expansion bus protocols such as PCIe. The high speed card to card connectivity provided by the secondary data path switch 911 could be ten gigabit ethernet, SPI4.2, Interlaken or other high speed packet interface. The secondary data path switch 911 may also make use of the inter-expansion bus module link 418 to provide a communication path between add-in cards that are installed in different expansion bus modules 103-104. The secondary data path switch 911 could be incorporated into the enhanced expansion bus backplane 900 or could be on a separate add-in card if all of the extension connector signals could be routed to a special purpose add-in card slot where the secondary data path switch 911 could be housed. This solution becomes attractive if there is not sufficient area on the enhanced expansion bus backplane to contain all of the circuitry required to implement high speed packet based communications between expansion slots 401-405. The enhanced expansion bus backplane 900 could be incorporated into an enhanced expansion bus module providing an upgrade path to the system. A user could simply remove the expansion bus module 103-104 from a system that is already deployed and replace it with an enhanced expansion bus module to realize the performance enhancements made possible by the secondary data path switch 911. The ability to upgrade the expansion bus of the system while it remains in the datacenter rack is a feature of the present invention that is not found in similar networking appliance chassis designs.

It will be appreciated that an exemplary embodiment of the invention has been described, and persons skilled in the art will appreciate that many variants are possible within the scope of the invention.

All references mentioned above are herein incorporated by reference

We claim:

1. A networking appliance comprising:
 a chassis;
 a motherboard mounted on said chassis, said motherboard including an expansion bus containing at least one expansion slot;
 at least one separately removable expansion module mounted on said chassis;
 a plurality of card slots in said expansion module for accommodating expansion cards;
 connection means for providing a signal connection between card slots in said at least one expansion module and at least one said expansion slot on the motherboard;
 extension connectors associated with said card slots for supplying additional signals to add-in cards associated with said card slots independently of said connection means; and
 a data path switch for providing high speed connectivity between said extension connectors.

2. A networking appliance as claimed in claim 1, wherein said connection means includes a midplane between said at least one expansion module and said motherboard, said midplane including one or more pluggable connectors for receiving said at least one expansion module.

3. A networking appliance as claimed in claim 2, wherein said pluggable connectors are blind mate connectors.

4. A networking appliance as claimed in claim 2, further comprising flexible cables providing connection between said midplane and said at least one expansion bus to provide mechanical isolation between said midplane and said at least one expansion bus.

5. A networking appliance as claimed in claim 2, further comprising a system controller connected to said midplane for controlling communication between components connected to the midplane including said motherboard.

6. A networking appliance as claimed in claim 5, wherein said motherboard includes front panel connections, and said front panel connections are routed through said midplane to said system controller, and said system controller comprises externally accessible push buttons and indicator lamps connected thereto.

7. A networking appliance as claimed in claim 3, wherein said at least one expansion module comprises a cage containing said plurality of card slots.

8. A networking appliance as claimed in claim 7, further comprising a backplane mounted in said cage supporting said card slots and connected to said at least one expansion bus through said connection means.

9. A networking appliance as claimed in claim 7, wherein said cage has an openable lid for providing easy access to said card slots.

10. A networking appliance as claimed in claim 7, wherein said cage is slidably removable from said chassis.

11. A networking appliance as claimed in claim 9, wherein said openable lid includes spring means for applying a spring force against cards located in said card slots when said lid is in the closed position.

12. A networking appliance as claimed in claim 8, further comprising an expansion bus switch between said connection means and said card slots for routing signals thereto.

13. A networking appliance as claimed in claim 1, wherein the data path switch is housed in an add-in card slot on said backplane.

14. A networking appliance as claimed in claim 1, wherein said connection means includes an electrical isolator for electrically isolating said at least one expansion module from said motherboard while allowing signals to pass therethrough.

15. A networking appliance as claimed in claim 14, wherein said isolator is a repeater configured to remove noise from signals passing therethrough.

16. A networking appliance comprising:
 a chassis:
 a motherboard mounted on said chassis, said motherboard including at least one expansion bus connector, input/output connectors, and a front panel connector;
 a power supply mounted on said chassis;
 a midplane mounted on said chassis, said midplane providing a wiring hub connected to said connectors on said motherboard;
 a power supply mounted on said chassis connected to said midplane and said off motherboard;
 at least one separately removable expansion module mounted on said chassis and pluggable into connectors on said midplane;
 a plurality of card slots in said expansion module for accommodating expansion cards;

extension connectors associated with said card slots for supplying additional signals to add-in cards associated with said card slots independently of said connection means; and a data path switch for providing high speed connectivity between said extension connectors, wherein said midplane provides connectivity between said at least one expansion module and other components mounted on said chassis.

17. A networking appliance as claimed in claim 16, comprising flexible cables connecting said midplane to said connectors on said motherboard.

18. A networking appliance as claimed in claim 17, wherein said connectors on said midplane into which said expansion modules are pluggable are blind mate connectors.

19. A networking appliance as claimed in claim 16, wherein said at least one expansion module comprises a cage slidably removable from said chassis.

20. A networking appliance as claimed in claim 16, wherein said midplane further comprises a system controller controlling interconnectivity between components connected thereto.

21. A networking appliance as claimed in 17, wherein said cage comprises a slotted wall for mounting card bulkheads and exposing said card bulkheads for external access.

22. A networking appliance as claimed in claim 16, wherein said at least one expansion module comprises a cage with an openable lid, and a backplane in said cage providing support for said card slots.

23. A networking appliance as claimed in claim 22, further comprising spring means on said lid for spring loading cards inserted in said card slots.

* * * * *